(12) United States Patent
Saito et al.

(10) Patent No.: US 10,195,838 B2
(45) Date of Patent: Feb. 5, 2019

(54) METHOD FOR PRODUCING DEPOSITION MASK

(71) Applicant: V TECHNOLOGY CO., LTD., Yokohama-shi (JP)

(72) Inventors: Yuji Saito, Yokohama (JP); Shuji Kudo, Yokohama (JP); Takayuki Kosuge, Yokohama (JP); Michinobu Mizumura, Yokohama (JP)

(73) Assignee: V TECHNOLOGY CO., LTD., Yokohama-shi (JP)

( * ) Notice: Subject to any disclaimer, the term of this patent is extended or adjusted under 35 U.S.C. 154(b) by 547 days.

(21) Appl. No.: 14/853,934

(22) Filed: Sep. 14, 2015

(65) Prior Publication Data

US 2016/0001542 A1 Jan. 7, 2016

Related U.S. Application Data

(63) Continuation of application No. PCT/JP2014/053614, filed on Feb. 17, 2014.

(30) Foreign Application Priority Data

Mar. 15, 2013 (JP) ................. 2013-053207

(51) Int. Cl.
*B32B 38/10* (2006.01)
*C23C 14/04* (2006.01)
*B32B 15/00* (2006.01)

(52) U.S. Cl.
CPC .............. *B32B 38/10* (2013.01); *B32B 15/00* (2013.01); *C23C 14/042* (2013.01); *B32B 2310/0843* (2013.01)

(58) Field of Classification Search
CPC . B32B 38/10; B32B 15/00; B32B 2310/0843; C23C 14/12; C23C 14/042
See application file for complete search history.

(56) References Cited

U.S. PATENT DOCUMENTS 5,887,520 A * 3/1999 Kinoshita ................. B41C 1/14
101/128.4
2004/0163592 A1* 8/2004 Abiko ................... C23C 14/042
118/715

(Continued)

FOREIGN PATENT DOCUMENTS

CN 102877022 A 1/2013
JP 2003-064468 A 3/2003

(Continued)

OTHER PUBLICATIONS

Nishi, Takehiro, JP 20051970436A Machine Translation.*

(Continued)

*Primary Examiner* — Jacob J Cigna
*Assistant Examiner* — Lee A Holly
(74) *Attorney, Agent, or Firm* — Morgan, Lewis & Bockius LLP

(57) ABSTRACT

The present invention relates to a method for producing a deposition mask having a structure in which a metal mask sheet with a plurality of opening patterns formed is disposed under tension on and fixed to a metal frame, the method including: a first step of bonding a peripheral part of the metal mask sheet to a synthetic fiber mesh to which constant tension is applied; a second step of cutting off a part of the mesh corresponding to a deposition effective region with a size capable of arranging therein the plurality of opening patterns of the metal mask sheet; a third step of connecting and fixing the frame to the peripheral part of the metal mask sheet on an opposite side to the mesh; and a fourth step of removing the mesh from the metal mask sheet.

2 Claims, 5 Drawing Sheets

(56) References Cited

U.S. PATENT DOCUMENTS

2009/0127236 A1    5/2009   Hong et al.
2013/0015444 A1    1/2013   Hirai

FOREIGN PATENT DOCUMENTS

| JP | 2004-190057 A |   | 7/2004 |
|----|---------------|---|--------|
| JP | 2004190057 A  | * | 7/2004 |
| JP | 2005-005070 A |   | 1/2005 |
| JP | 2005-197043 A |   | 7/2005 |
| JP | 2005197043 A  | * | 7/2005 |
| JP | 2009-074160 A |   | 4/2009 |
| JP | 2013-021165 A |   | 1/2013 |
| JP | 2013-108143 A |   | 6/2013 |
| TW | 200947156 A   |   | 11/2009 |

OTHER PUBLICATIONS

Obara, Kinji, JP 2004190057A Machine Translation.*
International Preliminary Report on Patentability dated Sep. 24, 2015, which issued in PCT/JP2014/053614; and English language translation thereof.
Japanese Office Action dated Oct. 18, 2016, which issued in Japanese Application No. 2013-053207, together with partial English language translation thereof.
Chinese Office Action dated Dec. 21, 2016, which issued in Chinese Application No. 201480014059.4.
Taiwanese Office Action from Taiwanese Application No. 103106023, dated Feb. 8, 2017.

* cited by examiner

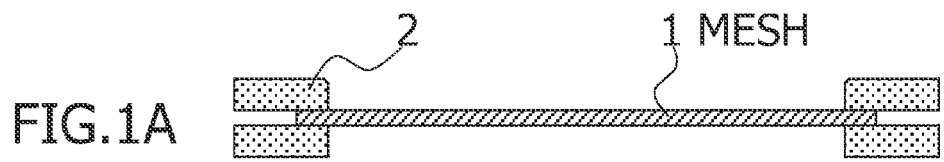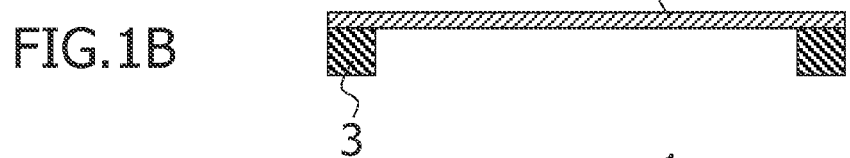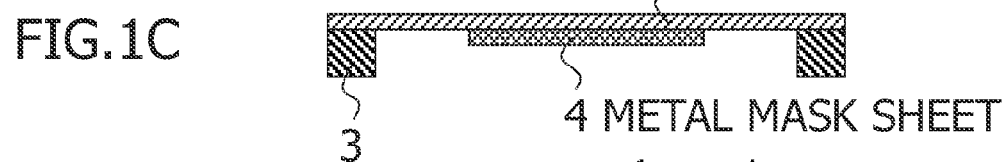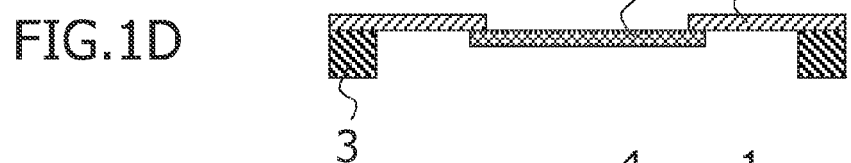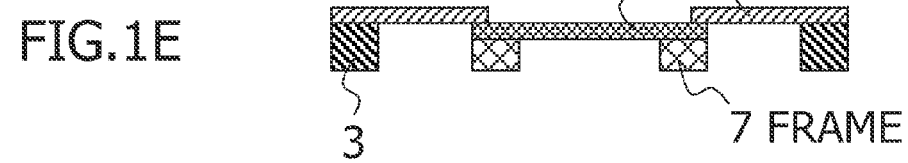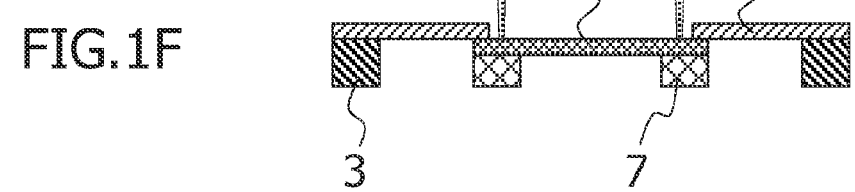

METHOD FOR PRODUCING DEPOSITION MASK

CROSS-REFERENCE TO RELATED APPLICATION

This application is a continuation application of International Patent Application No. PCT/JP2014/053614, filed on Feb. 17, 2014, which is hereby incorporated by reference in its entirety for all purposes.

BACKGROUND OF THE INVENTION

1. Field of the Invention

The present invention relates to a method for producing a deposition mask having a structure in which a mask sheet with plurality of opening patterns formed is disposed under tension on and fixed to a metal frame, and more particularly, relates to a method for producing a deposition mask, capable of fixing a mask sheet to a frame with uniform tension applied to an entire surface of the mask sheet.

2. Description of Related Art

A conventional method for producing a deposition mask includes: etching a metal sheet by using a resist mask; forming a plurality of penetrating opening patterns; and subsequently spot-welding a metal frame to a peripheral part of the metal sheet in a state in which the metal sheet is provided under tension (see, for example, Japanese Patent Application Laid-open Publication No. 2009-074160).

However, in such a conventional method for producing a deposition mask, since the metal sheet is fixed directly to the frame in the state of being stretched in four directions, it was difficult to apply uniform tension to an entire surface of the metal sheet. Therefore, there has been a problem that, depending on a way in which the tension is applied to the metal sheet, wrinkles and deflection or break of a metal part between the adjacent opening patterns may occur to the metal sheet, or the formed opening pattern may be deformed.

SUMMARY OF THE INVENTION

The present invention deals with the problem, and seeks to provide a method for producing a deposition mask, capable of fixing a mask sheet to a frame with uniform tension applied to an entire surface of the mask sheet.

In order to achieve the object, a method for producing a deposition mask according to a first aspect of the present invention is a method for producing a deposition mask having a structure in which a mask sheet with a plurality of opening patterns formed is disposed under tension on and fixed to a metal frame, the method including: a first step of bonding a peripheral part of the mask sheet to a synthetic fiber mesh to which constant tension is applied; a second step of cutting off a part of the mesh corresponding to a deposition effective region with a size capable of arranging therein the plurality of opening patterns of the mask sheet; a third step of connecting and fixing the frame to the peripheral part of the mask sheet on an opposite side to the mesh; and a fourth step of removing the mesh from the mask sheet.

Furthermore, a method for producing a deposition mask according to a second aspect of the present invention is a method for producing a deposition mask having a structure in which a mask sheet with a plurality of opening patterns formed is disposed under tension on and fixed to a metal frame, the method including: a first step of bonding a peripheral part of a resin film of a mask member having a structure in which the resin film is tightly connected to one surface of a sheet-shaped magnetic metal member provided with a plurality of through holes, each having a size capable of arranging therein at least one of the opening patterns, to a synthetic fiber mesh to which constant tension is applied, arranging the film side of the mask member to be in contact with the mesh side; a second step of cutting off a part of the mesh corresponding to a deposition effective region with a size capable of arranging therein the plurality of through holes of the mask member; a third step of connecting and fixing the frame to a peripheral part of the magnetic metal member of the mask member on an opposite side to the mesh; a fourth step of removing the mesh from the mask member; and a fifth step of irradiating a part of the film corresponding to the opening pattern exposed through the through hole of the magnetic metal member with laser lights, so as to form the opening pattern.

According to the present invention, since the mask sheet or the mask member is fixed to the frame in the state in which the mask sheet or the mask member is provided under tension using the synthetic fiber mesh, uniform tension can be applied to an entire surface of the mask sheet or the mask member. Therefore, wrinkles and deflection are not likely to occur to the mask sheet or the mask member, and the formed opening patterns are not likely to be deformed. Accordingly, formation position precision of the opening patterns can be improved.

BRIEF DESCRIPTION OF THE DRAWINGS

FIGS. 1A to 1G are cross-sectional views that illustrate a method for producing a deposition mask according to a first embodiment of the present invention, and a process of connecting a mask sheet to a frame.

FIGS. 2A and 2B are drawings that illustrate one constitutional example of a metal mask sheet as the mask sheet, in which FIG. 2A is a plan view, and FIG. 2B is a partially enlarged cross-sectional view.

FIGS. 3A and 3B are drawings that illustrate one constitutional example of a complex-type mask sheet as the mask sheet, in which FIG. 3A is a plan view, and FIG. 3B is a partially enlarged cross-sectional view.

FIGS. 4A and 4B are drawings that illustrate a mask member before forming opening patterns of the complex-type mask sheet, in which FIG. 4A is a plan view, and FIG. 4B is a partially enlarged cross-sectional view.

DESCRIPTION OF PREFERRED EMBODIMENTS

Figure 2A:
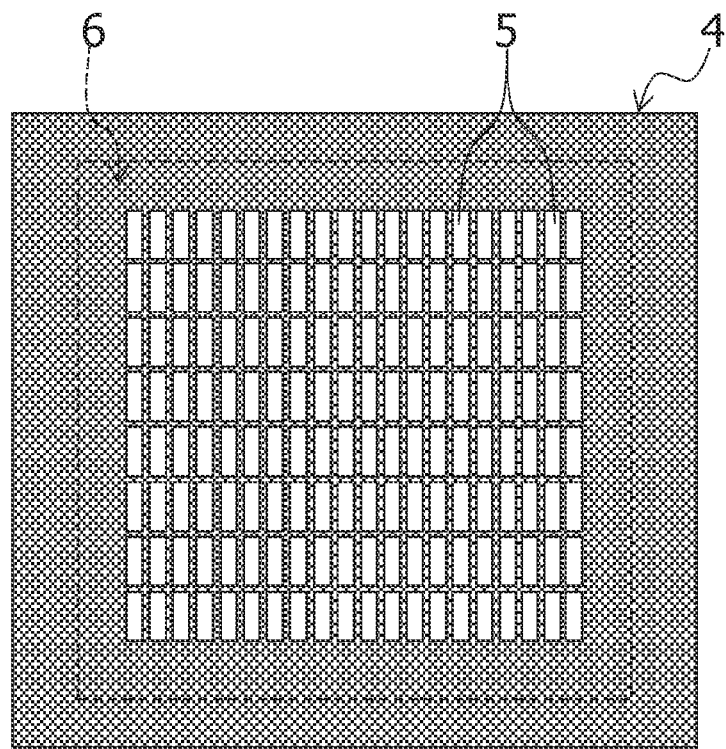

Hereunder, a first embodiment of the present invention will be described in detail with reference to the accompanying drawings. FIGS. 1A to 1G are cross-sectional views that illustrate a method for producing a deposition mask according to an embodiment of the present invention, and a process of connecting a mask sheet to a frame. This method for producing the deposition mask is for producing a deposition mask having a structure in which a mask sheet with a plurality of opening patterns formed is disposed under tension on and fixed to a metal frame, and the method includes: a first step of bonding a peripheral part of the mask sheet to a synthetic fiber mesh to which constant tension is applied; a second step of cutting off a part of the mesh corresponding to a deposition effective region with a size capable of arranging therein the plurality of opening patterns of the mask sheet; a third step of connecting and fixing the frame to the peripheral part of the mask sheet on an opposite side to the mesh; and a fourth step of removing the mesh from the mask sheet. Hereunder, the respective steps will be described in detail. Explanation of a case in which the mask sheet is a metal mask sheet 4 in which a plurality of opening patterns 5 are formed by etching a sheet-shaped magnetic metal material of, for example, Invar, etc., by using a resist mask, as illustrated in FIG. 2A, will be provided.

In the first step, first, as illustrated in FIG. 1A, edge portions on four sides of a rectangular synthetic fiber mesh 1, made of, for example, polyester, etc., are pinched by clips 2, and the mesh 1 is stretched in four directions at predetermined constant tension. At this time, the uniform tension is applied to the mesh 1 over its entire surface due to its own elasticity.

Then, as illustrated in FIG. 1B, an end face of a support frame 3, made of, for example, aluminum (Al), etc., is brought into contact with one of the surfaces (a lower surface in the figure) of the mesh 1, and an adhesive is applied to the end face of the support frame 3 from an upper side of the mesh 1, so that the mesh 1 is bonded to the end face of the support frame 3 with the adhesive, which has penetrated through the mesh 1. Thereafter, the mesh 1 is cut off along an outer peripheral part of the support frame 3, thereby forming the mesh 1 fixed to the support frame 3 in the state in which the mesh 1 is provided under tension.

Subsequently, as illustrated in FIG. 1C, a metal mask sheet 4 is arranged at a center part of the mesh 1 within the support frame 3, for example, on the back of the mesh 1, and an adhesive is applied from the upper side of the mesh 1 along a peripheral part of the metal mask sheet 4, so that the peripheral part of the metal mask sheet 4 is bonded to the mesh 1 with the adhesive, which has penetrated through the mesh 1. Thereby, the first step is completed. The metal mask sheet 4 may be bonded to the front of the mesh 1. In this case, the processes may be carried out similarly, except that the support frame 3 to which the mesh 1 is bonded is flipped upside down.

Figure 2B:
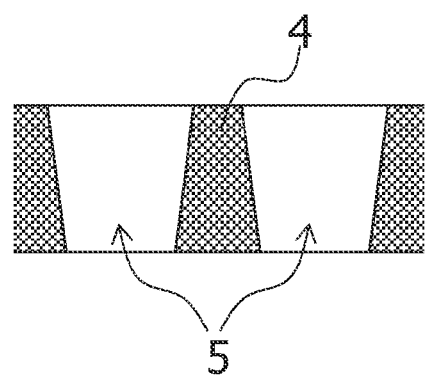

In the second step, as illustrated in FIG. 1D, a part of the mesh 1 having a size capable of arranging therein the plurality of opening patterns 5 formed in the metal mask sheet 4 (see FIGS. 2A and 2B), and having an outline along a peripheral part of a deposition effective region 6, indicated by being surrounded by a broken line in FIG. 2A, is cut by, for example, a cutter, etc., and is removed. Thereby, the uniform tension that has been applied to the mesh 1 is transferred to the metal mask sheet 4, so that the metal mask sheet 4 is stretched in the four directions at the uniform tension.

In the third step, first, as illustrated in FIG. 1E, an end face of a frame 7 of, for example, Invar, Invar alloy, etc., is brought into contact with the peripheral part of the metal mask sheet 4 on an opposite side to the mesh 1. At this time, an edge portion of the metal mask sheet 4 and an edge portion of the frame 7 may be monitored with a camera, and deviation of location of the frame 7 with respect to the metal mask sheet 4 may be adjusted. Furthermore, two opening patterns 5, each located on the right side or the left side of the metal mask sheet 4 and separated apart by a certain distance, may be monitored by two cameras, and then, a strength of the tension may be adjusted by expanding and contracting the mesh 1 by pinching a part of the mesh 1 that is located within the support frame 3 and outside the metal mask sheet 4 by additional clips (not illustrated), so that a distance between the monitored opening patterns 5 becomes a predetermined distance.

Subsequently, as illustrated in FIG. 1F, the peripheral part of the metal mask sheet 4 is irradiated with laser lights L so as to spot-weld the metal mask sheet 4 and the frame 7. Thereby, the metal mask sheet 4 is fixed to the frame 7 in the state in which the uniform tension is applied to an entire surface of the metal mask sheet 4. In this case, since the metal mask sheet 4 and the frame 7 are spot-welded, there is no risk that their connecting part is loosen by heat generated during the deposition so as to deform the metal mask sheet 4, or a deposited film is contaminated by a gas released due to outgassing, unlike bonding using an organic adhesive.

In the fourth step, as illustrated in FIG. 1G, the mesh 1 outside the welded part is cut along the outer periphery of the metal mask sheet 4 by, for example, a cutter, etc., thereby removing the mesh 1 from the metal mask sheet 4. Alternatively, the mesh 1 may be removed from the metal mask sheet 4 by irradiating the bonded part of the mesh 1 and the metal mask sheet 4 with laser lights so as to burn off the mesh 1, or by softening the adhesive by applying appropriate temperature to the bonded part. Thereby, a deposition mask in which the metal mask sheet 4 is disposed under uniform tension on and fixed to the frame 7 can be obtained.

Figure 3A:
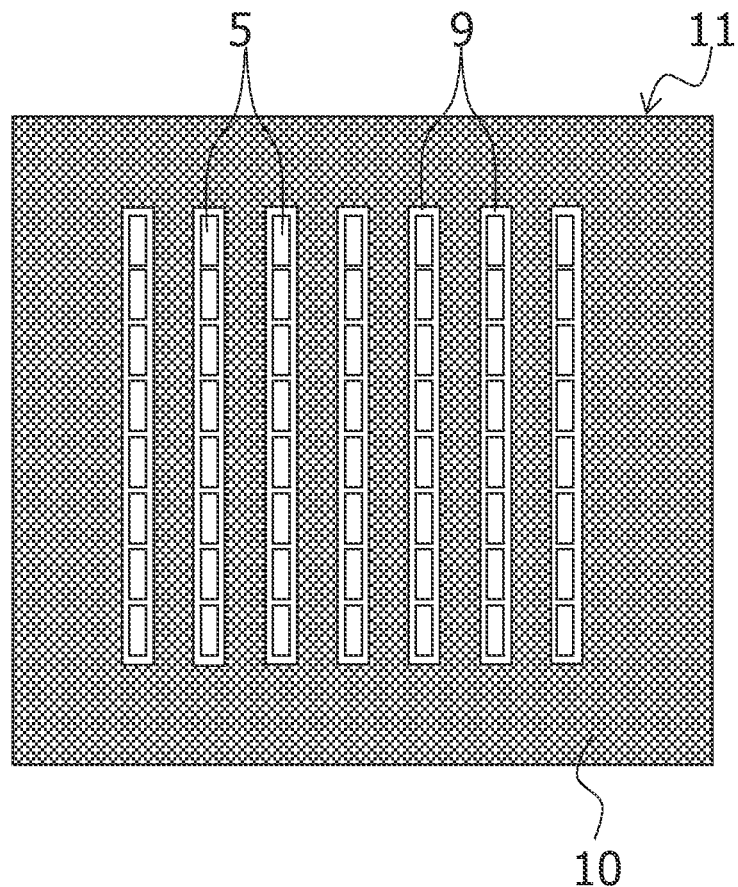
Figure 3B:
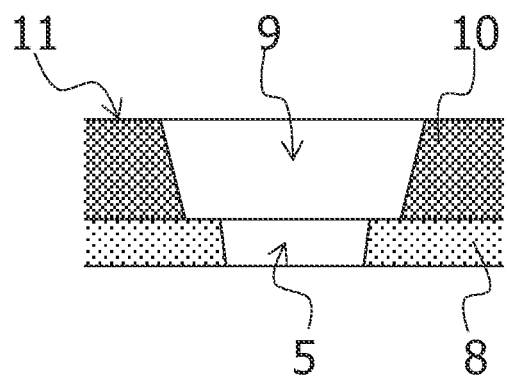

In the foregoing, the case in which the mask sheet is the metal mask sheet 4 was described, but the mask sheet may be a complex-type mask sheet 11 having a structure in which a resin film 8 and a sheet-shaped magnetic metal member 10 are tightly connected. The resin film 8 is provided with a plurality of opening patterns 5, and is made of, for example, polyimide, etc., and is capable of transmitting a visible light. The magnetic metal member 10 is provided with a plurality of through holes 9, each having a size capable of arranging therein at least one of the opening patterns 5, and is made of Invar, Invar alloy, nickel, nickel alloy, etc., as illustrated in FIGS. 3A and 3B.

In the case in which the mask sheet is the complex-type mask sheet 11, in a first step, a peripheral part of the film 8 is bonded to a mesh 1, similarly to the above first step, arranging the film 8 side of the complex-type mask sheet 11 to be in contact with the mesh 1.

Furthermore, in a third step, similarly to the above third step, a frame 7 is connected and fixed to a peripheral part of the magnetic metal member 10 on an opposite side to the mesh 1.

The complex-type mask sheet 11 can be formed as follows. That is, after applying resin liquid of, for example, polyimide, so as to provide a certain thickness, to one surface of the sheet-shaped magnetic metal member 10 of, for example, Invar, etc., with a thickness ranging from about 30 μm to about 50 μm, the resin liquid is dried, thereby forming the film 8 with a thickness ranging from about 10 μm to about 30 μm. Next, after applying a photoresist to the other surface of the magnetic metal member 10 and exposing the photoresist to light by using a photomask, the photoresist is developed, thereby forming a resist mask having openings corresponding to that of the through holes 9 to be formed. Thereafter, the magnetic metal member 10 is etched by using the resist mask, whereby the through holes 9 that reach the film 8 are formed in the magnetic metal member 10. Subsequently, parts of the film 8 exposed through the through holes 9 are irradiated with laser lights, thereby forming the opening patterns 5.

Alternatively, the complex-type mask sheet 11 may be formed as follows. That is, after forming a base layer of conductive metal such as, for example, nickel, etc., with a thickness of about 50 nm on the resin film 8, a photoresist is applied onto the base layer, and the photoresist is subjected to patterning by a known method so as to form island patterns in the same shapes as those of the through holes 9 at positions that correspond to the through holes 9. Next, the magnetic metal member 10 is formed by electroplating at portions covered with no island patterns. Subsequently, the island patterns are removed, and then, parts of the base layer that had been covered with the island patterns is etched to be removed, thereby forming the through holes 9. Then, parts of the film 8 exposed through the through holes 9 are irradiated with laser lights similarly to the above step, thereby forming the opening patterns 5.

Figure 4A:
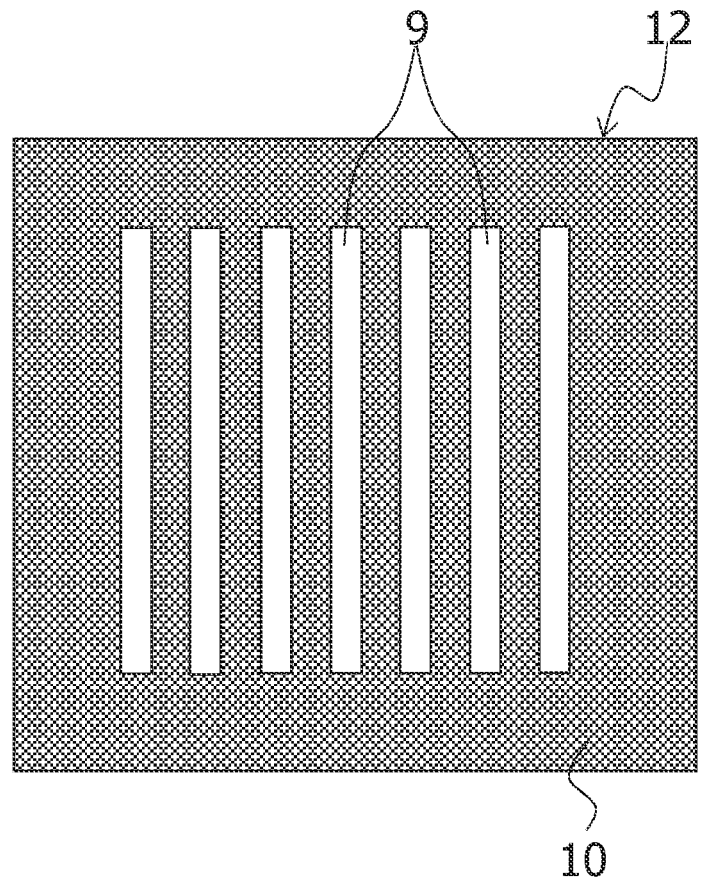
Figure 4B:
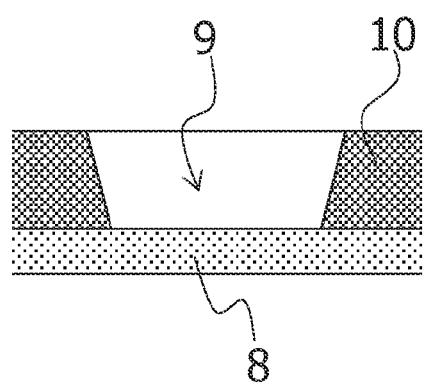

Furthermore, in the case in which the mask sheet is the complex-type mask sheet 11, the first to fourth steps may be carried out using a mask member 12 as illustrated in FIGS. 4A and 4B, as a substitute of the mask sheet. The mask member 12 is a member before forming opening patterns 5 at parts of a film 8 exposed through a plurality of through holes 9 of a magnetic metal member 10.

Figure 5A:
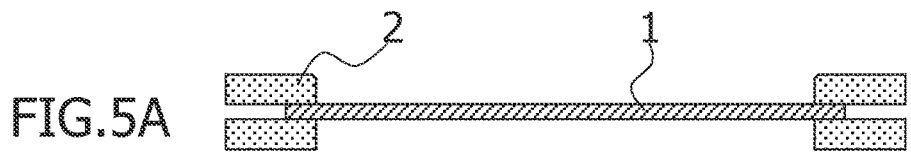
FIGS. 5A to 5G are cross-sectional views that illustrate a method for producing a deposition mask according to a second embodiment of the present invention.
Figure 5B:
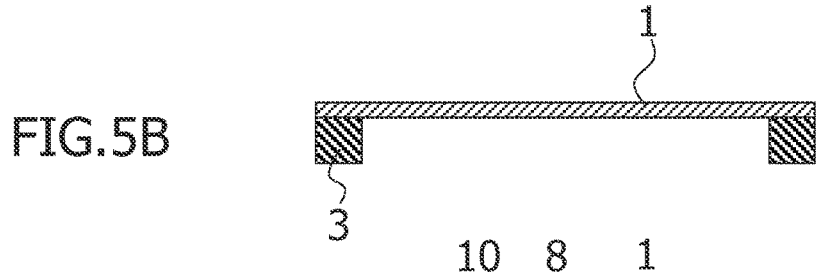
Figure 5C:
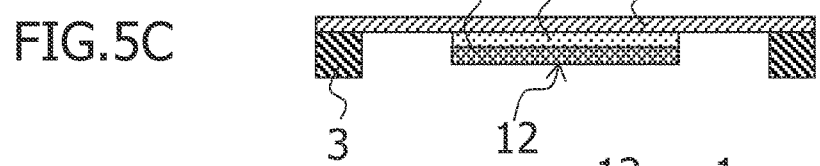
Figure 5D:
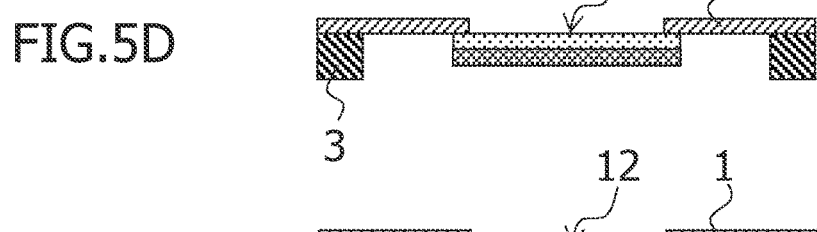
Figure 5E:
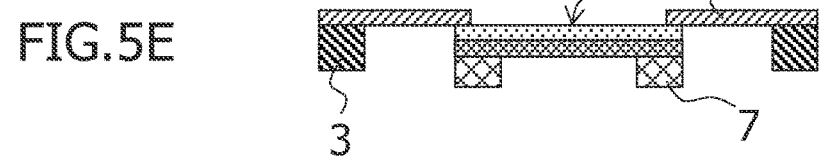
Figure 5F:
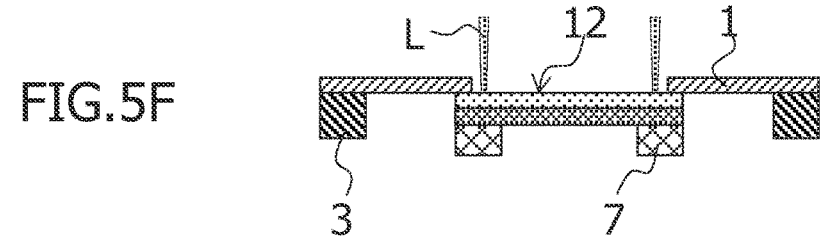
Figure 5G:
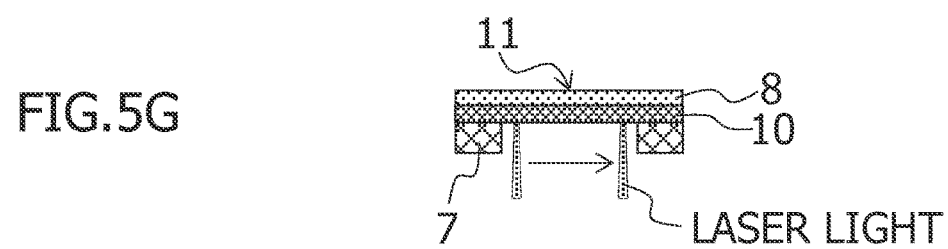

That is, in a first step, a peripheral part of the resin film 8 of the mask member 12 having a structure in which the resin film 8 is tightly connected to one surface of the sheet-shaped magnetic metal member 10 provided with the plurality of through holes 9, each having the size capable of arranging therein at least one of the opening patterns 5, is bonded to a synthetic fiber mesh 1 to which the constant tension is applied, arranging the film 8 side of the mask member 12 to be in contact with the mesh 1 (see FIGS. 5A to 5C). Furthermore, in a second step, a part of the mesh 1 corresponding to a deposition effective region having a size capable of arranging therein the plurality of through holes 9 of the mask member 12, is cut off (see FIG. 5D). Moreover, in a third step, a frame 7 is connected and fixed to the peripheral part of the magnetic metal member 10 of the mask member 12 on the opposite side to the mesh 1 (see FIGS. 5E and 5F). Then, the mesh 1 is removed from the mask member 12.

In this case, a fifth step, in which parts of the film 8 corresponding to the opening patterns 5 and exposed through the through holes 9 of the magnetic metal member 10 are irradiated with laser lights so as to form the opening patterns 5, is to be further carried out. Thereby, since the mask member 12 disposed under uniform tension on and fixed to the frame 7 is irradiated with the laser lights so as to form the opening patterns 5, the formation position precision of the opening patterns 5 can be improved more.

In the embodiment, the case in which the mesh 1 is disposed under tension on and fixed to the support frame 3 was explained, but the present invention is not limited thereto. The second step and its subsequent steps may be carried out while a mask sheet or a mask member 12 is bonded to a mesh 1 pinched by clips 2 and stretched in the four directions so as to be provided under tension, without being fixed to the support frame 3.

It should be noted that the entire contents of Japanese Patent Application No. 2013-053207, filed on Mar. 15, 2013, on which convention priority is claimed, is incorporated herein by reference.

It should also be understood that many modifications and variations of the described embodiments of the invention will be apparent to one skilled in the art without departing from the spirit and scope of the present invention as claimed in the appended claims.

What is claimed is:

1. A method for producing a deposition mask having a structure in which a mask sheet with a plurality of opening patterns formed is disposed under tension on and fixed to a metal frame, the method comprising successive steps of:
a first step of bonding a peripheral part of a resin film of a mask member having a structure in which the resin film is connected to one surface of a sheet-shaped magnetic metal member provided with a plurality of through holes, each having a size capable of arranging therein at least one of the opening patterns, to a synthetic fiber mesh to which constant tension is applied, arranging the film side of the mask member to be in contact with the mesh;
a second step of cutting off a part of the mesh corresponding to a deposition effective region with a size capable of arranging therein the plurality of through holes of the mask member;
a third step of connecting and fixing the frame to a peripheral part of the magnetic metal member of the mask member on an opposite side to the mesh;
a fourth step of removing the mesh from the mask member; and
a fifth step of irradiating a part of the film corresponding to the opening pattern exposed through the through hole of the magnetic metal member with laser lights, so as to form the opening pattern.

2. The method for producing a deposition mask according to claim 1, wherein the connecting of the frame to the mask member is made by spot welding.

* * * * *